United States Patent
Tsuji et al.

(10) Patent No.: US 7,807,566 B2
(45) Date of Patent: Oct. 5, 2010

(54) METHOD FOR FORMING DIELECTRIC SIOCH FILM HAVING CHEMICAL STABILITY

(75) Inventors: Naoto Tsuji, Tama (JP); Kiyohiro Matsushita, Tama (JP); Manabu Kato, Shibata (JP); Noboru Takamure, Tama (JP)

(73) Assignee: ASM Japan K.K., Tokyo (JP)

( * ) Notice: Subject to any disclaimer, the term of this patent is extended or adjusted under 35 U.S.C. 154(b) by 309 days.

(21) Appl. No.: 11/952,891

(22) Filed: Dec. 7, 2007

(65) Prior Publication Data

US 2009/0148964 A1 Jun. 11, 2009

(51) Int. Cl.
*H01L 21/4763* (2006.01)

(52) U.S. Cl. ............ 438/624; 438/70; 257/E21.53

(58) Field of Classification Search ............ 438/70, 438/624; 257/E21.53
See application file for complete search history.

(56) References Cited

U.S. PATENT DOCUMENTS 6,846,515 B2  10/2007  Vrtis et al.

2005/0006665 A1 * 1/2005 Ohnishi et al. ............. 257/200

OTHER PUBLICATIONS

Tsang et al. "Comparative studies of physical and chemical properties of plasma-treated CVD low k SiOCH dielectrics." Thin Solid Films 462-463 (2004), pp. 269-274.*
Kemeling et al. "A robust k ~ 2.3 SiCOH low-k film formed by porogen removal with UV-cure." Microelectronic Engineering 84 (May 2007), pp. 2575-2581.*
Lee et al. "Effect of Annealing Temperature on Dielectric Constant and Bonding Structure of Low-k SiCOH Thin Films Deposited by Plasma Enhanced Chemical Vapor Deposition." vol. 46, #2 (Feb. 2007) pp. 536-541.*

* cited by examiner

*Primary Examiner*—Thao X Le
*Assistant Examiner*—Geoffrey Ida
(74) *Attorney, Agent, or Firm*—Knobbe, Martens, Olson & Bear LLP

(57) ABSTRACT

A method for determining conditions for forming a dielectric SiOCH film, includes: (i) forming a dielectric SiOCH film on a substrate under conditions; (ii) evaluating the conditions using a ratio of Si—CH3 bonding strength to Si—O bonding strength of the film as formed in step (i); (iii) if the ratio is 2.50 % or higher, confirming the conditions, and if the ratio is less than 2.50 %, changing the conditions by changing at least one of the susceptor temperature, the distance between upper and lower electrodes, the RF power, and the curing time; and (iv) repeating steps (i) to (iii) until the ratio is 2.50 % or higher.

17 Claims, 2 Drawing Sheets

METHOD FOR FORMING DIELECTRIC SIOCH FILM HAVING CHEMICAL STABILITY

BACKGROUND OF THE INVENTION

1. Field of the Invention

The present invention generally refers to a semiconductor technology. In particular, it relates to a method for forming on a semiconductor substrate a silicon-containing insulation film having high chemical stability and low dielectric constant by using a plasma CVD (chemical vapor deposition) apparatus.

2. Description of the Related Art

The demand for semiconductors offering higher processing speeds and smaller circuits in recent years is giving rise to a need to reduce wiring resistances and inter-wiring volumes to prevent signal delays in multi-layer wiring structures.

To reduce wiring resistances, wirings that use copper as the main conductor material are being examined. To form copper wirings, the so-called damascene structure is used wherein a wiring metal that uses copper as the main conductor material is deposited on a substrate, including inside grooves formed in an insulation film, after which excessive wiring metal in areas outside the grooves is removed by the CMP method to form a wiring pattern in the grooves. With the damascene structure, a wiring metal is deposited on a substrate, including the inside grooves, after which excessive wiring metal in areas outside the grooves is removed by the CMP method to form wirings inside the grooves. Damascene structures are largely divided into single damascene and dual damascene structures. A single damascene structure is formed, for example, by the following procedure: (1) Deposit an insulation film and cure the film; (2) Form trenches in the insulation film; (3) deposit a wiring metal on the insulation film and also inside the trenches; and (4) grind the wiring metal layer via CMP so that the metal remains only inside the trench. This way, embedded wirings can be formed inside the trenches. A dual damascene structure is formed, for example, by the following procedure: (1) Deposit an insulation film and cure the film; (2) form trenches, as well as via holes in the insulation film for connection with the bottom wiring layer; (3) deposit a wiring metal layer on this insulation film and also inside the trenches and via holes; and (4) grind the wiring metal layer via CMP so that the metal remains only inside the trenches and via holes. This way, embedded wirings can be formed inside the trench and via holes. There are mainly two ways to form a dual damascene structure, including [1] the method to form trenches first, and [2] the method to form via holes first. Of the two methods, [2] involves a simpler process and is therefore used more widely.

In either of the structures described above, the inter-layer insulation films are etched using hard mask, photoresist or other masking material as deemed appropriate, after which ashing is performed. However, it is impossible to remove all residues, and thus wet etching must be performed using a chemical solution. If an insulation film of low dielectric constant is used for inter-layer films, this wet etching presents problems such as increase in dielectric constant and decrease in film thickness. U.S. Pat. No. 6,846,515 describes a method for forming an insulation film of low dielectric constant by forming voids in film through a curing process using porogen gas. However, this method cannot solve the aforementioned problems in practical applications involving semiconductor devices.

To reduce inter-wiring volumes, the dielectric constants of insulation films between multiple wiring layers must be lowered, and therefore insulation films of low dielectric constants have been developed for this purpose.

Traditionally a silicon oxide film SiOx is formed by adding oxygen O2 as an oxidizing agent, as well as nitrogen oxide NO or nitrous oxide N2O, to SiH4, Si(OC2 H5)4 or other silicon material gas, and then processing the mixture by means of heat or plasma energy. Silicone oxide films thus formed have a dielectric constant ∈ of approx. 4.0. On the other hand, the spin coat method that uses inorganic silicon oxide glass (SOG) as a material forms insulation films having a low dielectric constant ∈ of approx. 2.3. Also, the plasma CVD method that uses CxFyHz as the material gas forms fluorinated amorphous carbon films having a low dielectric constant ∈ in a range of 2.0 to 2.4. In addition, the plasma CVD method that uses a silicon-containing hydrocarbon (such as P-TMOS (phenyl trimethoxysilane)) as the material gas forms insulation films having a low dielectric constant ∈ of approx. 3.1. Furthermore, the plasma CVD method that uses a silicon-containing hydrocarbon having multiple alkoxy groups as the material gas, forms insulation films having a low dielectric constant ∈ of approx. 2.5 through optimization of conditions.

However, the aforementioned traditional approaches present problems as described below. First, inorganic SOG insulation films formed by the spin coat method present problems in that the material is not evenly distributed over the silicon substrate and that the apparatus used in the curing process after coating of material is expensive. Also, fluorinated amorphous carbon films formed by the plasma CVD method using CxFyHz as the material gas have drawbacks including low heat resistance of the film (370° C. or below), poor adhesion property with respect to silicon materials, and low mechanical strength of the film. If P-TMOS having three alkoxy groups is used among silicon-containing hydrocarbons, the polymerized oligomer cannot form a linear structure like that of siloxane. As a result, a porous structure is not formed on the silicon substrate and the dielectric constant cannot be lowered to a desired level. If other silicon-containing hydrocarbon having multiple alkoxy groups is used as the material gas, the polymerized oligomer obtained under optimized conditions forms a linear structure like that of siloxane, which allows for formation of a porous structure on the silicon substrate and lowering of the dielectric constant to a desired level. However, this oligomer having a linear structure provides weak inter-oligomer bonding strength, thus resulting in low mechanical strength of the film.

SUMMARY OF THE INVENTION

From the aforementioned viewpoints, a technology to form a damascene structure by adopting a porous insulation film of low dielectric constant (SiOCH film) for inter-layer films is being examined. However, the technical problems mentioned above are not solved yet. To be specific, with a damascene structure the inter-layer insulation films are etched using hard mask, photoresist or other masking material as deemed appropriate, after which ashing is performed. However, it is impossible to remove all residues, and thus wet etching must be performed using a chemical solution. If a porous insulation film of low dielectric constant (SiOCH film) is used for inter-layer films, this wet etching tends to present problems such as increase in dielectric constant and decrease in film thickness.

The present invention was developed to address the aforementioned problems, and aims to provide a method for forming a silicon-containing insulation film having high chemical stability and low dielectric constant.

Another object of the present invention is to provide a method for forming an insulation film of low dielectric constant in an easy manner without increasing the apparatus cost.

To solve at least one of the aforementioned problems, in an embodiment of the present invention the method for forming low dielectric constant film consists of the steps described below. To be specific this method for forming a SiOCH low dielectric constant film as insulation films between wiring layers is characterized in that the ratio of strength of Si—CH3 bond and Si—O bond in the SiOCH film is 2.50% or more.

In an embodiment of the present invention, the method for forming an insulation film of low dielectric constant using the plasma CVD method consists of: (a) a step to introduce into a reaction chamber a set of material gases including a silicon-containing hydrocarbon that contains multiplecrosslinkable groups such as alkoxy groups and/or vinyl groups, a porogen gas, an oxidizing gas, and an inert gas; (b) a step to apply first RF power and second RF power to generate a plasma reaction field in the reaction chamber, or apply only the first RF power; and (c) a step to optimize the flow rate of each material gas and the output of each RF power.

Among the material gases, the silicon-containing hydrocarbon having multiple crosslinkable groups consists of one silicon-containing hydrocarbon having one or more crosslinkable groups or a combination of such silicon-containing hydrocarbons. The porogen gas is a hydrocarbon having a linear or cyclic structure expressed by the general formula $C_nH_m$, where n is selected from the group consisting of numbers 4 to 14, while m is selected from the group consisting of numbers 4 to 30, respectively. Specifically, the porogen is selected from the group consisting of α-terpinene, β-terpinene, γ-terpinene, hexane and cyclohexane. The oxidizing gas is selected from the group consisting of O2 and N2O. The inert gas is He, Ar, Kr or Xe or any combination thereof. Since each of these gases has a different ionization energy and collision cross-section area, the reaction in the vapor phase can be controlled by changing the combination of these gases.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

DETAILED DESCRIPTION OF THE PREFERRED EMBODIMENT

Figure 1:
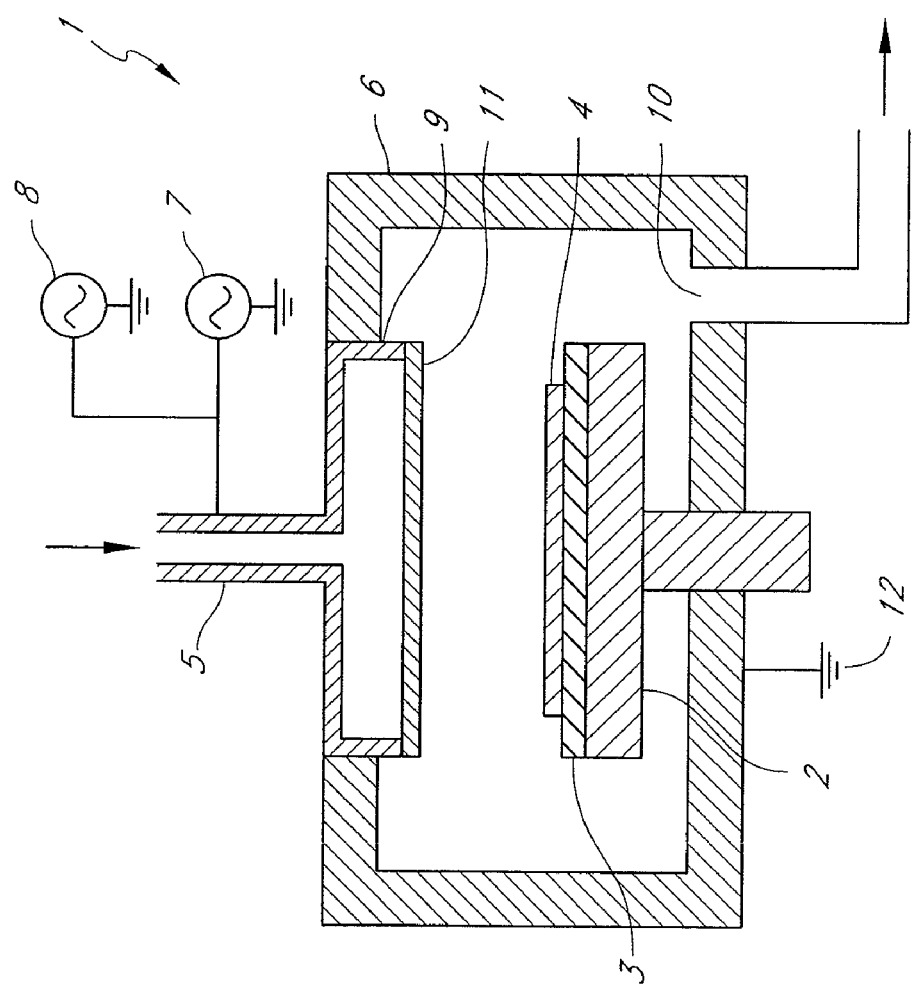
FIG. 1 is a schematic diagram of a plasma CVD apparatus usable in an embodiment of the present invention.

The present invention will be explained in detail with reference to preferred embodiments. However, the preferred embodiments are not intended to limit the present invention.

In an embodiment, the present invention provides a method for determining conditions for forming a dielectric SiOCH film, comprising: (i) forming a dielectric SiOCH film on a substrate under conditions including a susceptor temperature, a distance between upper and lower electrodes, an RF power, and a curing time; (ii) evaluating the conditions using a ratio of Si—-CH3 bonding strength to Si—O bonding strength of the film as formed in step (i); (iii) if the ratio is 2.50% or higher, confirming the conditions, and if the ratio is less than 2.50%, changing the conditions by changing at least one of the susceptor temperature, the distance between upper and lower electrodes, the RF power, and the curing time; and (iv) repeating steps (i) to (iii) until the ratio is 2.50% or higher (including 2.6%, 2.8%, 3.0%, 3.2%, 3.5%, and values between any two numbers of the foregoing, preferably 2.5% to 3.2%). The ratio may be determined based on an FT-IR spectrum of the film, although any suitable method can be employed. By the above method, the conditions for forming a dielectric SiOCH film can effectively be determined, which film is suitable for damascene processes because a dielectric constant and a thickness of the film do not change significantly before and after curing.

The above embodiment further includes, but is not limited to, the following embodiments:

In an embodiment, the film as formed in step (i) may have a dielectric condition (k) and an elastic modulus (EM) which satisfy 2.3<k<2.8 and 5 GPa<EM, preferably 2.4<k<2.6 and 8 GPa<EM. In an embodiment, the dielectric constant of the film may be in a range of 1.1 g/cm3 to 1.5 g/cm3.

In any of the foregoing embodiments, step (iii) may comprise, if the ratio is less than 2.50%, reducing the susceptor temperature, increasing the distance between the upper and lower electrodes, decreasing the RF power, and/or shortening the curing time. In any of the foregoing embodiments, the curing time may be a time of UV curing.

In any of the foregoing embodiments, step (i) may comprise: (a) introducing a silicon-containing hydrocarbon gas having a crosslinkable group, a porogen gas, an oxidizing gas, and an inert gas into a reaction chamber wherein the substrate is placed on the susceptor; (b) applying RF power to the reaction chamber between the upper and lower electrodes to generate a plasma reaction region in the reaction chamber, thereby depositing a thin film on a substrate; and (c) curing the thin film until a dielectric condition (k) and an elastic modulus (EM) of the film satisfy 2.3<k<2.8 and 5 GPa<EM, preferably 2.4<k<2.6 and 8 GPa<EM.

In any of the foregoing embodiments, in step (iii), under the confirmed conditions, a decrease of thickness of the film and an increase of dielectric constant of the film may be less than 3% (including 2.5%, 2%, 1.5%, 1%, 0.5%, and values between any two numbers of the foregoing) and less than 0.25 (including 0.2, 0.15, 0.1, 0.05, and values between any two numbers of the foregoing), respectively, before and after the curing.

In another aspect, the present invention provides a method for forming a dielectric SiOCH film on a substrate, comprising: (I) confirming the conditions for forming a dielectric SiOCH film according to any of the foregoing determination methods; and (II) forming a dielectric SiOCH film on a substrate under the conditions.

The above embodiment further includes, but is not limited to, the following embodiments:

In an embodiment, the curing may be UV curing.

In any of the foregoing embodiments, the forming step may comprise: (A) introducing a silicon-containing hydrocarbon gas having a crosslinkable group, a porogen gas, an oxidizing gas, and an inert gas into a reaction chamber wherein the substrate is placed on the susceptor; (B) applying RF power to the reaction chamber between the upper and lower electrodes to generate a plasma reaction region in the reaction chamber, thereby depositing a thin film on a substrate; and (C) curing the thin film until a dielectric condition (k) and an elastic modulus (EM) of the film satisfy 2.3<k<2.8 and 5 GPa<EM, preferably 2.4<k<2.6 and 8 GPa<EM. The decrease of thickness of the film and the increase of dielectric constant of the film are described above.

In any of the foregoing embodiments, the silicon-containing hydrocarbon gas may be at least one selected from the group consisting of silicon-containing hydrocarbon gases having alkoxyl group and/or vinyl group as the crosslinkable group. In any of the foregoing embodiments, the porogen gas may be at least one selected from the group consisting of hydrocarbon gases of linear or cyclic CnHm wherein n is an integer of 4-14 and m is an integer of 4-30. Further, the porogen gas may be at least one selected from the group consisting of α-terpinene, β-terpinene, γ-terpinene, hexane, and cyclohexane. In any of the foregoing embodiments, the oxidizing gas may be at least one selected from the group consisting of O2 and N2O. In any of the foregoing embodiments, the inert gas may be at least one selected from the group consisting of He, Ar, Kr, and Xe. In any of the foregoing embodiments, the curing may be conducted by UV light for a time period of less than 700 seconds (including 500 sec., 300 sec., 100 sec., and values between any two numbers of the foregoing; in other embodiments, 300-3600 sec.) under curing conditions of 90 mW/cm2 of UV high pressure mercury lamp at 400° C., for example.

In still another aspect, the present invention provides a method for forming an interconnect structure on a substrate, comprising: (1) forming a dielectric SiOCH film on a substrate according to any of the foregoing forming methods; and (2) forming an interconnect structure on the substrate by single or dual damascene.

In yet another aspect, the present invention provides the following embodimens:

1) A method for forming an insulation film on a substrate, characterized in that the ratio of strength of Si—CH3 bond and Si—O bond in the SiOCH film is 2.50% or more according to FT-IR.

2) A method for forming low dielectric film according to 1) above, characterized in that the ratio of strength of Si—CH3 bond and Si—O bond in the SiOCH film is in a range of 2.50% to 3.20%.

3) A method for forming low dielectric film according to 1) or 2) above, characterized in that the dielectric constant of the SiOCH film is 2.6 or less.

4) A method for forming low dielectric film according to any one of 1) to 3) above, characterized in that the elastic modulus of the SiOCH film is 8 GPa or more.

5) A method for forming low dielectric film according to any one of 1) to 4) above, characterized in that the SiOCH film is formed by the plasma CVD method.

6) A method for forming low dielectric film according to 5) above, wherein such method forms the film on a substrate through: (a) a step to introduced into a reaction chamber in which a substrate is placed a set of reactant gases including (A) a material gas constituted by a silicon-containing hydrocarbon having multiple crosslinkable gas, (B) a porogen gas, (C) an oxidizing gas, and (D) an inert gas; (b) a step to apply RF power to form a plasma reaction field in the reaction chamber; (c) a step to deposit a film by controlling the flow rates of reactant gases and the intensity of RF power; and (d) a curing step to form voids in the film.

7) A method according to 6) above, wherein the crosslinkable groups constituting the silicon-containing hydrocarbon are alkoxy and/or vinyl groups.

8) A method according to 6) or 7) above, wherein the porogen gas is a hydrocarbon having a linear or cyclic structure expressed by the general formula CnHm, where n is selected from the group consisting of numbers 4 to 14, while m is selected from the group consisting of numbers 4 to 30, respectively.

9) A method according to any one of 6) to 8) above, wherein the porogen gas is at least one selected from the group consisting of α-terpinene, β-terpinene, γ-terpinene, hexane and cyclohexane.

10) A method according to 7) above, wherein the material gas is a chemical substance expressed by the chemical formula $Si_\alpha O_{\alpha-1} R_{2\alpha-\beta+2}(OC_n H_{2n+1})_\beta$, where α is an integer of 1 to 3, β is 2 or 3, n is an integer of 1 to 3, and R is bonded with Si and selected from the group consisting of $C_{1-12}$ hydrocarbons, $C_{1-12}$ fluorocarbons, $C_{1-12}$ perfluorocarbons, H, D, F, Cl, Br and I.

11) A method according to 10) above, wherein α is 1 or 2, and β is 2.

12) A method according to 7) above, wherein the material gas is diethoxy methylsilane.

13) A method according to 10) above, wherein R is one of $C_{1-6}$ hydrocarbons.

14) A method according to 7) above, wherein the material gas is dimethyl dimethoxysilane.

15) A method according to 7) above, wherein the material gas is 1,3-dimethoxy tetramethyl disiloxane.

16) A method according to 7) above, wherein the material gas is 1,3-divinyl tetramethyl disiloxane.

17) A method according to any one of 5) to 16) above, wherein the RF power has a single frequency.

18) A method according to 17) above, wherein the frequency is 2 MHz or more.

19) A method according to 18) above, wherein the frequency is 10 to 30 MHz.

20) A method according to any one of 6) to 19) above, wherein the inert gas is selected from the group consisting of Kr, Xe, Ar, Ne and He.

21) A method according to any one of 6) to 20) above, wherein the oxidizing gas is selected from the group consisting of O2 and N2O.

22) A method according to any one of 6) to 21) above, wherein the intensity of RF power is 0.5 W/cm2 to 2.0 W/cm2 (or 0.7 W/cm2 to 1.5 W/cm2).

23) A method according to any one of 6) to 22) above, wherein the inert gas is supplied at a flow rate of 5 to 30 times (or 10 to 20 times) the flow rate of the material gas.

24) A method according to any one of 6) to 23) above, wherein the curing process is implemented by means of thermal annealing, UV light or electron beam.

25) A method according to any one of 6) to 24) above, wherein the curing process is implemented at a temperature of 0 to 550° C. (or 100 to 450° C.) (normally a temperature of approx. 400° C. is used).

The present invention will be explained in detail with reference to the drawings and examples. However, the drawings and examples are not intended to limit the present invention.

An apparatus configuration that can be used in the examples of the present invention is described below, along with how it is used, and the resulting improvements are explained.

In the present disclosure where conditions and/or structures are not specified, the skilled artisan in the art can readily provide such conditions and/or structures, in view of the present disclosure, as a matter of routine experimentation. Also, in the present disclosure, the numerical numbers applied in embodiments can be modified by ±50% in other embodiments, and the ranges applied in embodiments may include or exclude the endpoints.

FIG. 1 is a schematic diagram of a plasma processing apparatus used in an embodiment of the present invention. This plasma processing apparatus 1 comprises a reaction chamber 6, gas introduction port 5, susceptor 3 and heater 2, and includes a second electrode. Gases are introduced from the gas introduction port 5 through a gas line (not illustrated). A circular first electrode 9 is positioned just below the gas introduction port 5, where the first electrode 9 has a hollow structure having many small holes in the bottom face through which gases are injected onto a processing target 4. The first electrode 9 is also structured in such a way that a shower plate 11 having multiple gas introduction holes can be replaced for easy maintenance and reduction of part costs.

Also, an exhaust port 10 is provided at the bottom of the reaction chamber 6. This exhaust port 10 is connected to an external vacuum pump (not illustrated) to exhaust the interior of the reaction chamber 6. The susceptor 3 is positioned in parallel with and facing the first electrode 9. The susceptor 3 retains the processing target 4 on top, continuously heats the processing target 4 by means of a heater 2, and thus maintains the substrate 4 at a specified temperature (0 to 500° C.). The gas introduction port 5 and first electrode 9 are insulated from the reaction chamber 6 and connected to a first RF power supply 7 provided externally. A second RF power supply 8 may be connected. 12 indicates ground. As a result, the first electrode 9 and second electrode function as high-frequency electrodes and generate a plasma reaction field near the processing target 4. The type and quality of the film formed on the surface of the processing target 4 vary according to the type and flow rate of the material gas, temperature, RF frequency type, as well as spatial distribution and potential distribution of plasma.

In an embodiment, chemical stability of the semiconductor device structure is evaluated by a blanket film acceleration test.

For your reference, a buffered fluorinated acid (HF:NH4F=1:30) is an example of the chemical agent used in this test. Although this buffered fluorinated acid is sometimes considered a mixture of hydrofluoric acid and ammonium fluoride, the hydrofluoric acid in the composition immediately changes to monohydrate ammonium difluoride once mixed. Accordingly, the buffered fluorinated acid is considered as a mixture of 5 g of monohydrate ammonium difluoride and 37 g of ammonium fluoride hereunder. The etching rate with respect to the thermal oxide film is approx. 700 Å .min if a buffered fluorinated acid of HF:NH4F=1:10 is used.

The acceleration test procedure used to evaluate the chemical stability of a blanket film is explained below.

[1] As a pre-measurement step, measure the thickness, dielectric constant (k) and FT-IR of the blanket film at one point at the center.

[2] Soak the film for 40 seconds in a water bath containing a buffered fluorinated acid mixed at a ratio of 1:30.

[3] Rinse the film for 30 minutes twice in a water bath containing pure water.

[4] Dry the film using nitrogen gas, and immediately measure the thickness, dielectric constant (k) and FT-IR of the film at one point at the center.

In an embodiment of the present invention, the SiOCH film is analyzed via FT-IR and the ratio of strength of Si—CH3 bond and Si—O bond shown in the spectral waveform is calculated using formula (1) from the measured values of Si—CH3 peak area and Si—O peak area.

Si—CH3/Si—O bond strength ratio (%)=(Si—CH3 peak area/Si—O peak area)×100 (1)

Figure 2A:
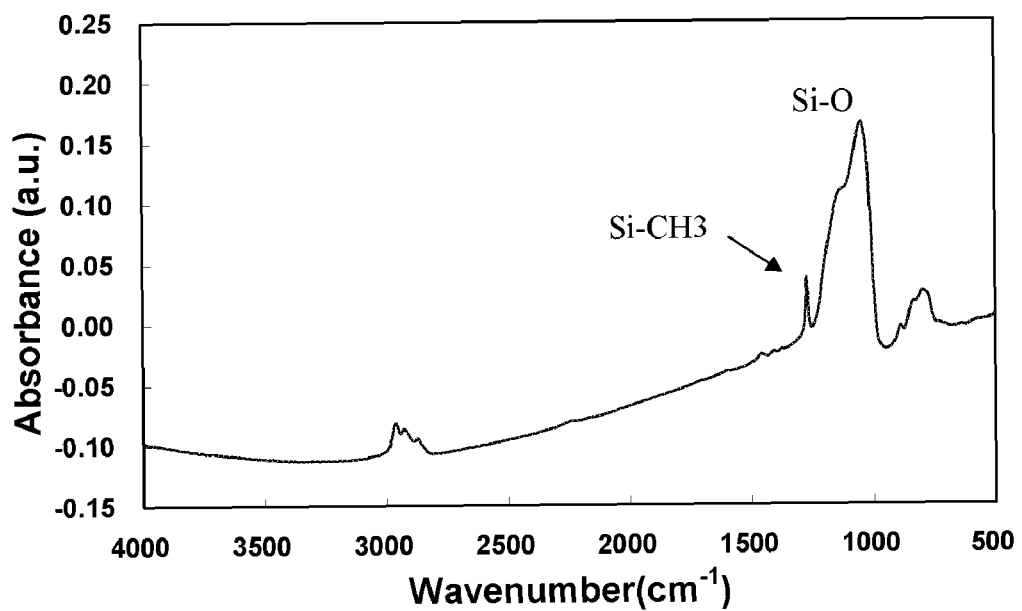
FIG. 2A is a FT-IR spectrum of a SiOCH film obtained in an embodiment of the present invention.
Figure 2B:
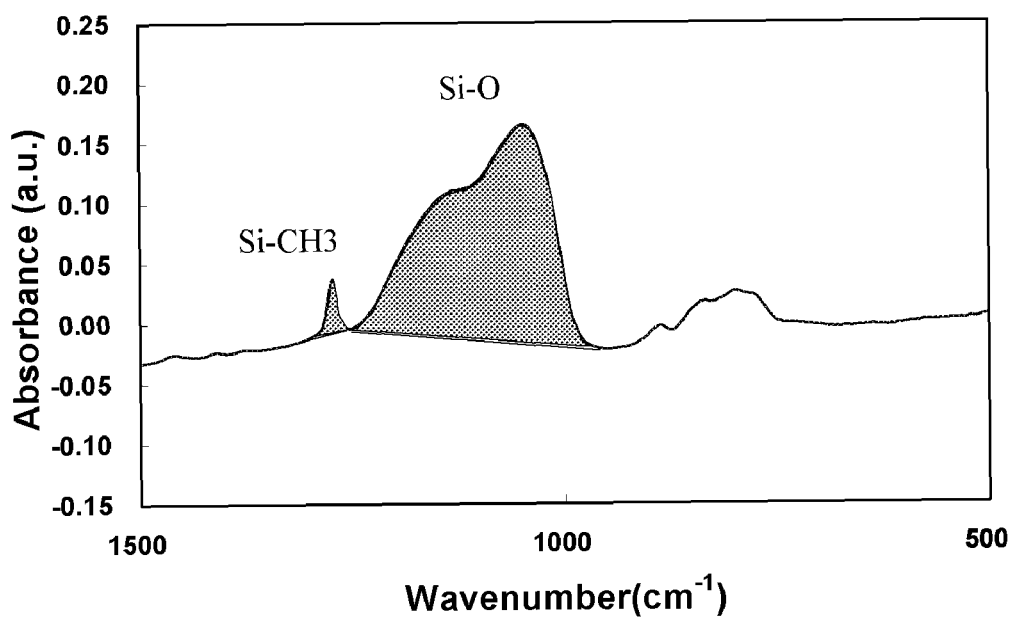
FIG. 2B is an enlarged partial FT-IR spectrum of FIG. 2A showing an area of Si—CH3 and an area of Si—O for calculating an area ratio.

FIG. 2 shows an example of the spectral waveform of a SiOCH film before curing, obtained via FT-IR. As shown, the Si—CH3 peak area and Si—O peak area are calculated.

Also, the chemical stability of a semiconductor device structure is known to present no problems in practical applications, from a different experiment, etc., conducted by the inventors, as long as the decrease in thickness (ΔThickness) is less than 15 nm and increase in dielectric constant (Δk) is less than 0.25.

EXAMPLES

Comparative Example

First, the evaluation result of a comparative example is explained. A film was formed on a silicon substrate with a diameter of 200 mm using the plasma CVD apparatus shown in FIG. 1. The film forming conditions were set as follows:

A: Material gas: DEMS (diethoxy methylsilane) 33 sccm
B: Porogen gas: ATRP (α-terpinene) 58 sccm
C: Oxidizing gas: O2 12.5 sccm
D: Inert gas: He 550 sccm
Susceptor temperature: 300° C.
Electrode gap: 10 mm
First RF power supply: 13.56 MHz, 1.1 W/cm$^2$
Curing conditions: UV (high-pressure mercury) 90 mW/cm$^2$, 400° C., 1,800 sec The curing time was selected to achieve a k of more than 2.4 but less than 2.6, and an elastic modulus of more than 8 GPa, after curing. For your information, the higher the temperature, the greater the effect. The Si—CH3/Si—O bond strength ratio according to the FI-IR spectrum of the obtained film, specific dielectric constant (k) after curing, change (increase) in specific dielectric constant (Δk), film thickness, change (decrease) in film thickness (ΔThickness), and elastic modulus, are shown in the top fields of Table 1.

Example

In the example, the conditions were set based on the following considerations.

As the Si—CH3/Si—O bond strength ratio increases, it is assumed that the percentage of CH3 ends increases relatively at the surface of the SiOCH film. Accordingly, a relative increase in the percentage of CH3 ends leads to an improvement in the chemical stability with respect to chemical solutions due to higher hydrophobicity. On the other hand, increasing the Si—CH3/Si—O bond strength ratio reduces the elastic modulus.

Among the parameters that increase the Si—CH3/Si—O bond strength ratio, changing the film forming conditions/curing conditions in the following manner are effective:

[1] Lower the susceptor temperature.
[2] Widen the Electrode gap.
[3] Lower the RF power.
[4] Shorten the UV curing time.

In consideration of the above, the film forming conditions/curing conditions were set as follows:

A: Material gas: DEMS (diethoxy methylsilane) 33 sccm, constant
B: Porogen gas: ATRP (α-terpinene) 58 sccm, constant
C: Oxidizing gas: )2 12.5 sccm, constant
D: Inert gas: He 550 sccm, constant
Susceptor temperature: 250 to 300° C.
Electrode gap: 10 to 16 mm (14 mm in this experiment)
First RF power supply: 13.56 MHz, 0.5 to 1.1 W/cm$^2$ (0.7 W/cm$^2$ in this experiment)
Curing conditions: UV (high-pressure mercury) 90 mW/cm$^2$, 400° C., 300 to 3,600 sec The curing conditions were optimized to achieve a k of more than 2.4 but less than 2.6, and an elastic modulus of more than 8 GPa, after curing. The Si—CH3/Si—O bond strength ratio according to the FI-IR spectrum of the obtained film, specific dielectric constant (k) after curing, change (increase) in specific dielectric constant (Δk), film thickness, change (decrease) in film thickness (ΔThickness), and elastic modulus, are shown in FIG. 1 (the film density was approx. 1.2 g/cm$^3$).

As shown in Table 1, increase in specific dielectric constant (Δk), and decrease in film thickness (ΔThickness), both exhibit a high degree of dependence on high Si—CH3/Si—O bond strength ratio.

TABLE 1

| SiCH3/SiO bond intensity ratio (%) | k | Δ k | Thickness (nm) | Δ Thickness (nm) | EM (GPa) | Cure (sec) |
|---|---|---|---|---|---|---|
| 1.69 | 2.49 | 0.62 | 399.2 | 80.9 | 9.11 | 1800 |
| 2.14 | 2.46 | 0.30 | 405.8 | 26.0 | 8.94 | 900 |
| 2.65 | 2.49 | 0.21 | 492.4 | 9.4 | 8.44 | 600 |
| 3.00 | 2.49 | 0.07 | 454.8 | 2.7 | 8.12 | 450 |

As shown above, by adjusting the Si—CH3/Si—O bond strength ratio of the SiOCH film to 2.50% or more, the decrease in film thickness (ΔThickness) becomes less than 15 nm, while the increase in dielectric constant (Δk) becomes less than 0.25, thereby allowing the chemical stability of the semiconductor device structure to be maintained within a range not presenting problems in practical applications. On the other hand, since the elastic modulus decreases as the Si—CH3/Si—O bond strength ratio increases, the range of Si—CH3/Si—O bond strength ratios of the film at which the elastic modulus also becomes more than 8 GPa is 2.50 to 3.20%. By using films meeting the above conditions in damascene structures, inter-layer boding structures can be built without negatively affecting the film characteristics.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for determining conditions for forming a cured dielectric SiOCH film subjected to wet etching, comprising:
   (i) forming a cured dielectric SiOCH film on a substrate by using at least a silicon-containing hydrocarbon gas having a crosslinkable group and a porogen gas and applying RF power to deposit a dielectric SiOCH film, and curing the dielectric SiOCH film, under conditions including a susceptor temperature, a distance between upper and lower electrodes, an RF power, and a curing time;
   (ii) evaluating the conditions using a ratio of Si—CH3 bonding strength to Si—O bonding strength of the cured film as formed in step (i);
   (iii) if the ratio is less than 2.50%, changing the conditions by at least decreasing the curing time to increase the ratio while substantially maintaining the dielectric constant of the film when cured in order to increase wet etching stability, wherein a change of dielectric constant and a change of thickness of the cured film are decreased before and after the cured film is subjected to wet etching, and in order to adjust the dielectric constant (k) of the cured film to satisfy 2.4<k<2.6, and the elastic modulus (EM) of the cured film to satisfy 8 GPa<EM; and
   (iv) repeating steps (i) to (iii) if the ratio is lower than 2.50%.

2. The method according to claim 1, wherein the ratio is determined based on an FT-IR spectrum of the film.

3. The method according to claim 1, wherein step (iii) comprises, if the ratio is less than 2.50%, reducing the susceptor temperature, increasing the distance between the upper and lower electrodes, and/or decreasing the RF power, in addition to shortening the curing time.

4. The method according to claim 1, wherein the curing time is a time of UV curing.

5. The method according to claim 1, wherein step (i) comprises:
   introducing the silicon-containing hydrocarbon gas having a crosslinkable group, the porogen gas, an oxidizing gas, and an inert gas into a reaction chamber wherein the substrate is placed on the susceptor; and
   applying RF power to the reaction chamber between the upper and lower electrodes to generate a plasma reaction region in the reaction chamber, thereby depositing a thin film on a substrate.

6. The method according to claim 1, further comprising subjecting the cured film to wet etching, a decrease of thickness of the film and an increase of dielectric constant of the film are less than 3% and less than 0.25, respectively, before and after the wet etching.

7. A method for forming a dielectric SiOCH film on a substrate, comprising:
   confirming the conditions for forming a dielectric SiOCH film according to claim 1; and
   forming a dielectric SiOCH film on a substrate under the conditions.

8. The method according to claim 7, wherein the curing is UV curing.

9. The method according to claim 7, wherein the forming step comprises:
   introducing a silicon-containing hydrocarbon gas having a crosslinkable group, a porogen gas, an oxidizing gas, and an inert gas into a reaction chamber wherein the substrate is placed on the susceptor; and
   applying RF power to the reaction chamber between the upper and lower electrodes to generate a plasma reaction region in the reaction chamber, thereby depositing a thin film on a substrate.

10. The method according to claim 7, further comprising subjecting the cured film to wet etching, wherein a decrease of thickness of the film and an increase of dielectric constant of the film are less than 3% and less than 0.25, respectively, before and after the wet etching.

11. The method according to claim 9, wherein the silicon-containing hydrocarbon gas is at least one selected from the group consisting of silicon-containing hydrocarbon gases having alkoxyl group and/or vinyl group as the crosslinkable group.

12. The method according to claim 9, wherein the porogen gas is at least one selected from the group consisting of hydrocarbon gases of linear or cyclic $C_nH_m$ wherein n is an integer of 4-14 and m is an integer of 4-30.

13. The method according to claim 12, wherein the porogen gas is at least one selected from the group consisting of α-terpinene, β-terpinene, γ-terpinene, hexane, and cyclohexane.

14. The method according to claim 9, wherein the oxidizing gas is at least one selected from the group consisting of $O_2$ and $N_2O$.

15. The method according to claim 9, wherein the inert gas is at least one selected from the group consisting of He, Ar, Kr, and Xe.

16. The method according to claim 9, wherein the curing is conducted by UV light for a time period of less than 700 seconds.

17. A method for forming an interconnect structure on a substrate, comprising:
- forming a dielectric SiOCH film on a substrate according to claim 9; and
- forming an interconnect structure on the substrate by single or dual damascene.

* * * * *